(12) United States Patent
Paul et al.

(10) Patent No.: US 8,921,179 B2
(45) Date of Patent: Dec. 30, 2014

(54) EDGE AND STRAP CELL DESIGN FOR SRAM ARRAY

(71) Applicants: Bipul C. Paul, Clifton Park, NY (US); Anurag Mittal, Wappinger Falls, NY (US); Pierre Malinge, La Tessoualle (FR)

(72) Inventors: Bipul C. Paul, Clifton Park, NY (US); Anurag Mittal, Wappinger Falls, NY (US); Pierre Malinge, La Tessoualle (FR)

(73) Assignee: GlobalFoundries Inc., Grand Cayman (KY)

( * ) Notice: Subject to any disclaimer, the term of this patent is extended or adjusted under 35 U.S.C. 154(b) by 26 days.

(21) Appl. No.: 13/766,228

(22) Filed: Feb. 13, 2013

(65) Prior Publication Data

US 2014/0225201 A1 Aug. 14, 2014

(51) Int. Cl.
| | |
|---|---|
| *H01L 21/8238* | (2006.01) |
| *G11C 11/412* | (2006.01) |
| *G06F 17/50* | (2006.01) |
| *H01L 27/02* | (2006.01) |
| *H01L 27/11* | (2006.01) |

(52) U.S. Cl.
CPC .......... *G11C 11/412* (2013.01); *G06F 17/5068* (2013.01); *H01L 27/0207* (2013.01); *H01L 27/1104* (2013.01)
USPC ................... 438/233; 438/230; 257/E21.661; 257/399

(58) Field of Classification Search
CPC .......................... H01L 27/1116; H01L 27/112
USPC ........... 438/233, 230; 257/E21.661, 399, 398
See application file for complete search history.

(56) References Cited

U.S. PATENT DOCUMENTS

| 8,224,637 B1 * | 7/2012 | Sowards et al. ................. 703/14 |
| 2003/0008222 A1 * | 1/2003 | Pierrat .............................. 430/5 |
| 2010/0193877 A1 * | 8/2010 | Liaw ............................ 257/390 |
| 2013/0141963 A1 * | 6/2013 | Liaw ............................ 365/156 |

OTHER PUBLICATIONS

Bipul Paul et al., U.S. Appl. No. 13/490,096, filed Jun. 6, 2012.

* cited by examiner

*Primary Examiner* — Caridad Everhart
(74) *Attorney, Agent, or Firm* — Ditthavong & Steiner, P.C.

(57) ABSTRACT

Methodology enabling a reduction of edge and strap cell size, and the resulting device are disclosed. Embodiments include: providing first and second NW regions on a substrate; providing first and second RX regions on the first and second NW regions, respectively; providing a contact on the substrate connecting the first and second RX regions; and providing a dummy PC on the substrate connecting the first and second RX regions. Other embodiments include: determining an RX region of an IC design; determining a PPLUS mask region extending along a horizontal direction and being on an entire upper surface of the RX region; determining a NW region extending along a vertical direction and separated from the RX region; and comparing an area of an overlap of the NW region and PPLUS mask region to a threshold value.

17 Claims, 9 Drawing Sheets

EDGE AND STRAP CELL DESIGN FOR SRAM ARRAY

TECHNICAL FIELD

The present disclosure relates to a manufacture of semiconductor devices utilizing a dummy gate (PC), an active (RX) region cut mask, and/or overlapping n-type well (NW) and implant mask regions. The present disclosure is particularly applicable in static random-access memory (SRAM) designs with edge and strap cells for the 20 nanometer (nm) technology node and beyond.

BACKGROUND

In fabrication of semiconductor devices, bitcell arrays may be separated by strap and edge cells. However, reducing a resulting size of strap and edge cells is restricted due to process limitations, particularly for 20 nm technology nodes and beyond. In some cases, strap and edge cells have increased in size when utilizing 20 nm technology compared to previous technologies.

A need therefore exists for methodology enabling a reduction in edge and strap cell size for a design, and the resulting device.

SUMMARY

An aspect of the present disclosure is a method of connecting taps by, inter alia, utilizing a dummy PC to connect the taps.

Another aspect of the present disclosure is a method of improving an RX region enclosure to implant mask by, inter alia, providing a dummy PC on a horizontal edge of an RX region.

An aspect of the present disclosure is a method of determining a gap/sliver restriction to reduce impacts due to implant mask corner rounding by, inter alia, comparing an area of overlap of an NW region and PPLUS implant layer to a threshold value prior to a data preparation step.

Another aspect of the present disclosure is a method of reducing a strap height without affecting a printability of RX regions by, inter alia, providing an RX cut block region on an extended portion of a printed RX region.

Another aspect of the present disclosure is a device having, inter alia, a dummy PC to connect taps and a dummy PC on a horizontal edge of an RX region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing first and second NW regions on a substrate; providing first and second RX regions on the first and second NW regions, respectively; providing a contact on the substrate connecting the first and second RX regions; and providing a dummy PC on the substrate connecting the first and second RX regions.

Aspects include a method, wherein the contact and dummy PC extend along a horizontal direction, the method further including providing a plurality of PC segments on the substrate, each PC segment extending along the horizontal direction on one of a plurality of vertical positions. Some aspects include: providing on the substrate first and second bitcell regions, each having PC segments on the vertical positions, the vertical positions within the first and second bitcells being separated; and providing on the substrate a strap region separating the first and second bitcell regions. Additional aspects include providing the first and second RX regions with first and second tap regions, respectively, the first and second tap regions being connected by the dummy PC and the contact. Further aspects include providing a p-type well (PW) region separating the first and second NW regions, and providing a gate contact in the PW region, wherein the first and second tap regions and gate contact are connected by the dummy PC and by the contact. Additional aspects include providing a PW tap in the PW region separated from the dummy PC and the contact. Further aspects include: providing a PW region on the substrate separating the first and second NW regions; providing a third RX region in the PW region having a vertical position different from vertical positions of the first and second RX regions; providing a block over an entire upper surface of the third RX region and a portion extending vertically beyond a horizontal edge of the third RX region; and providing a second dummy PC on the horizontal edge.

Additional aspects include providing the second dummy PC overlapping a rectangular portion of the third RX region. Further aspects include a method, wherein the second dummy PC extends along the horizontal direction, the method further including providing a plurality of PC segments on the substrate, each PC segment extending along the horizontal direction on one of a plurality of vertical positions. Some aspects include: providing a second PW region on the substrate, the second NW region separating the first and second PW regions; providing a fourth RX region in the second PW region having a vertical position identical to the third RX region and having a second horizontal edge aligned with the horizontal edge of the third RX; providing the block over an entire upper surface of the fourth RX region and a portion extending vertically beyond the second horizontal edge of the fourth RX region, the block extending across a horizontal width of the second NW region; and providing the second dummy PC on the second horizontal edge. Further aspects include: providing a first bitcell region having two PC segments active with different vertical positions; providing a second bitcell region having two PC segments active with different vertical positions; and providing a strap region vertically separating the first and second bitcell regions, the block and the third and fourth RX regions being in the strap region. Additional aspects include providing the first and second RX regions by: printing first and second RX regions on a substrate, each including an extended portion in a vertical direction; and providing an RX cut block region over the extended portions. Some aspects include providing on the substrate a third RX region having a vertical position different from the first and second RX regions by: printing the third RX region on the substrate including a second extended portion in a second vertical direction opposite to the first vertical direction; and providing the RX cut block region over the second extended portion.

Another aspect is a method including: determining an RX region of an integrated circuit (IC) design; determining a PPLUS implant mask region extending along a horizontal direction and being on an entire upper surface of the RX region; determining a NW region extending along a vertical direction and separated from the RX region; and comparing an area of an overlap of the NW region and PPLUS implant mask region to a threshold value.

Aspects include: determining a PW region of the IC design, the RX region being in the PW region; determining a second NW region, separated from the first NW region by the PW region, the PPLUS implant mask region extending into the first and second NW regions and across a horizontal width of the PW region; and determining a horizontal endpoint of the PPLUS implant mask region extending into the first NW region based on a predefined separation distance between endpoints of the RX region and the PPLUS implant mask region. Additional aspects include determining the threshold value based on a whether the area of overlap results in a generation of a TJ mask after a data preparation step for the IC design. Further aspects include modifying the PPLUS implant mask region to reduce the overlap area to less than or equal to the threshold value prior to a data preparation step for the IC design.

Another aspect is a device having: a first NW region on a substrate having a first NW tap; a second NW region on the substrate having a second NW tap; a PW region separating the first and second NW regions and having a PW tap and a gate contact, the gate contact and the first and second NW taps having identical vertical positions and the PW tap having a different vertical position from the gate contact and the first and second NW taps; a drain/source contact extending along a horizontal direction on the substrate and connecting the gate contact and the first and second NW taps, the drain/source contact being separated from the PW tap; a plurality of PC segments on the substrate, each PC segment extending along the horizontal direction on one of a plurality of separated vertical positions; and a dummy PC on the substrate extending along the horizontal direction on the substrate and connecting the gate contact and the first and second NW taps, the dummy PC having a vertical position different from a vertical position of the drain/source contact.

Aspects include the device having: an RX region in the PW region vertically separated from the first and second NW taps; an RG block over an entire upper surface of the RX region and a portion extending vertically outside of a horizontal edge of the RX region; and a second dummy PC extending in the horizontal direction and overlapping a rectangular portion of the RX region including the horizontal edge. Further aspects include the device having: a first bitcell region having two PC segments active with different vertical positions; a second bitcell region having two PC segments active with different vertical positions; and a strap region vertically separating the first and second bitcell regions, the RG block and the RX region being in the strap region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of edge and strap cell size reduction restrictions attendant upon fabricating scaled down SRAM devices, particularly devices utilizing 20 nm technology and beyond. The present disclosure addresses and solves such problems, for instance, by, inter alia, utilizing a dummy PC to connect the taps, providing a dummy PC on a horizontal edge of an RX region, comparing an area of overlap of an NW region and a PPLUS region to a threshold value, and providing an RX cut block region on an extended portion of a printed RX region.

Methodology in accordance with embodiments of the present disclosure includes: providing first and second NW regions on a substrate; providing first and second RX regions on the first and second NW regions, respectively; providing a contact on the substrate connecting the first and second RX regions; and providing a dummy PC on the substrate connecting the first and second RX regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
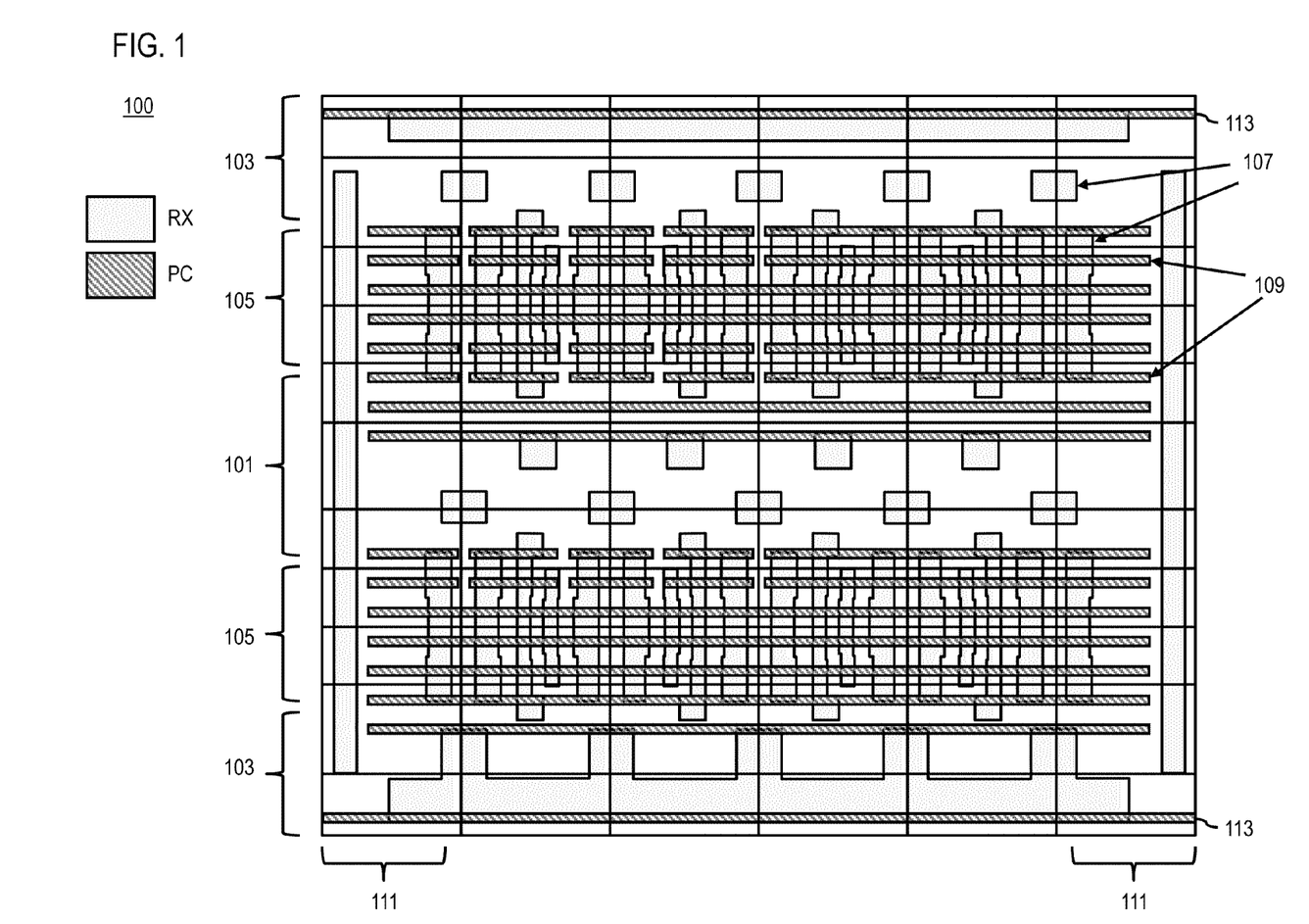
FIG. 1 schematically illustrates a SRAM bitcell in accordance with an exemplary embodiment.

FIG. 1 schematically illustrates a SRAM bitcell 100 in accordance with an exemplary embodiment. SRAM bitcell 100 includes a strap region 101 and bitline end cells 103 separated from the strap region 101 by active bitcell regions 105. As shown, SRAM bitcell 100 includes RX regions 107 and PC segments 109. PC segments 109 may be formed of, for example, metal or polysilicon and be equally spaced from each other as shown, or may have different spacing such as a first spacing in a first bitcell and a second spacing in a second bitcell. The active bitcell regions 105 further include wordline end cells 111. The bitline end cells 103 each have a height of 450 nm and include a dummy PC 113 on an outer edge of the outermost RX regions 107. As shown, the strap region 101 has PC segments 109 removed by a PC cutmask (CT) process.

Figure 2:
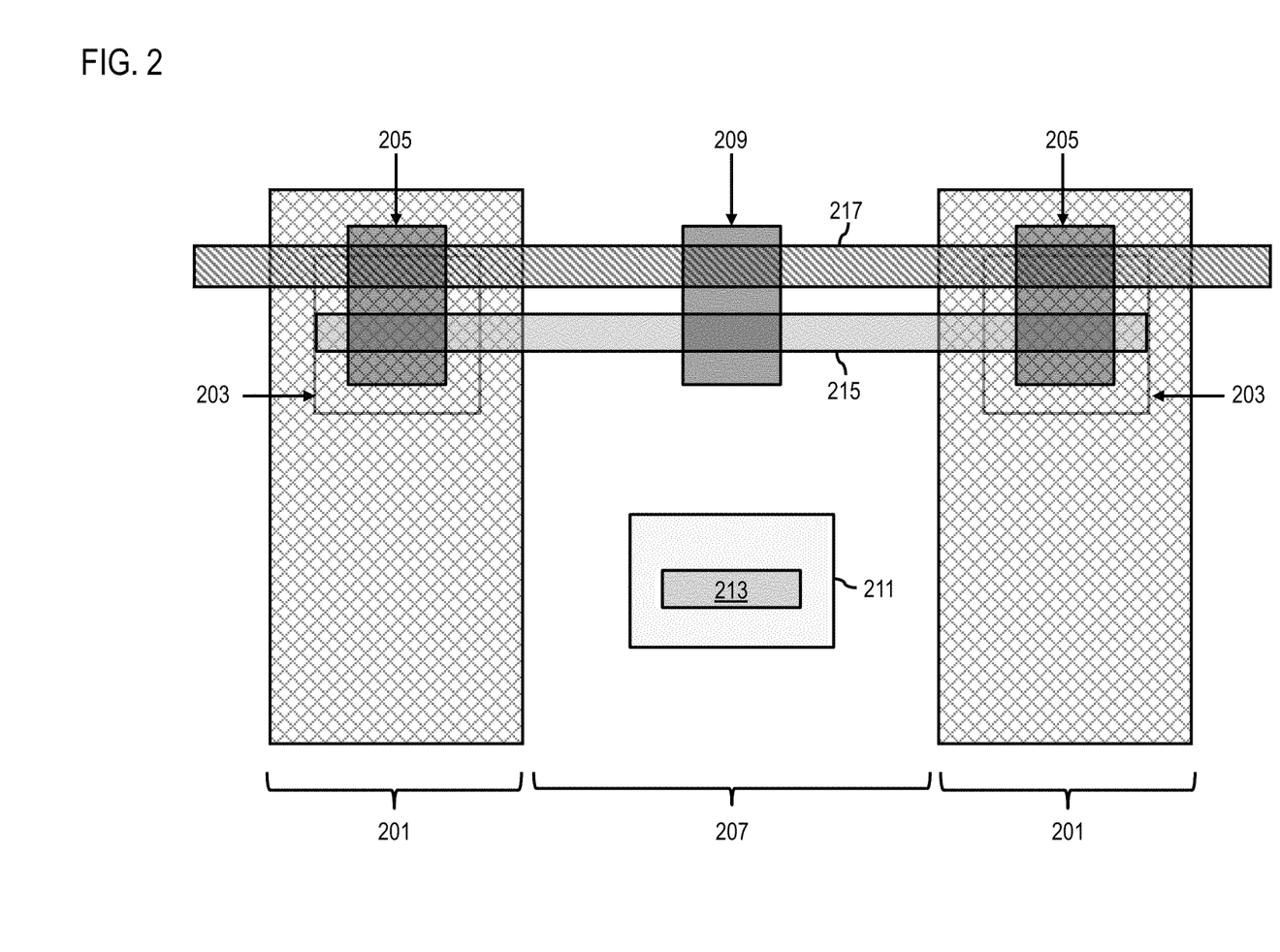
FIG. 2 schematically illustrates a method of connecting taps of a SRAM bitcell in accordance with an exemplary embodiment.

FIG. 2 schematically illustrates a method of connecting taps of a SRAM bitcell (e.g. 100) in accordance with an exemplary embodiment. Adverting to FIG. 2, an exemplary SRAM bitcell includes NW regions 201 having NW RX regions 203 and NW taps 205 separated by PW region 207 having a gate contact 209, a PW RX region 211, and PW tap 213. As illustrated, the NW RX regions 203 have a 114 nm width and a 108 nm height and the PW RX region 211 has a width of 140 nm and a height of 92 nm. Additionally, the NW taps 205 and gate contact 209 are connected by a source/drain contact 215. As shown, a (dummy) PC 217 is provided as a redundant connection of gate contact 209 to NW taps 205, resulting in a reduced latch-up and an improved yield of a resulting device.

Figure 3:
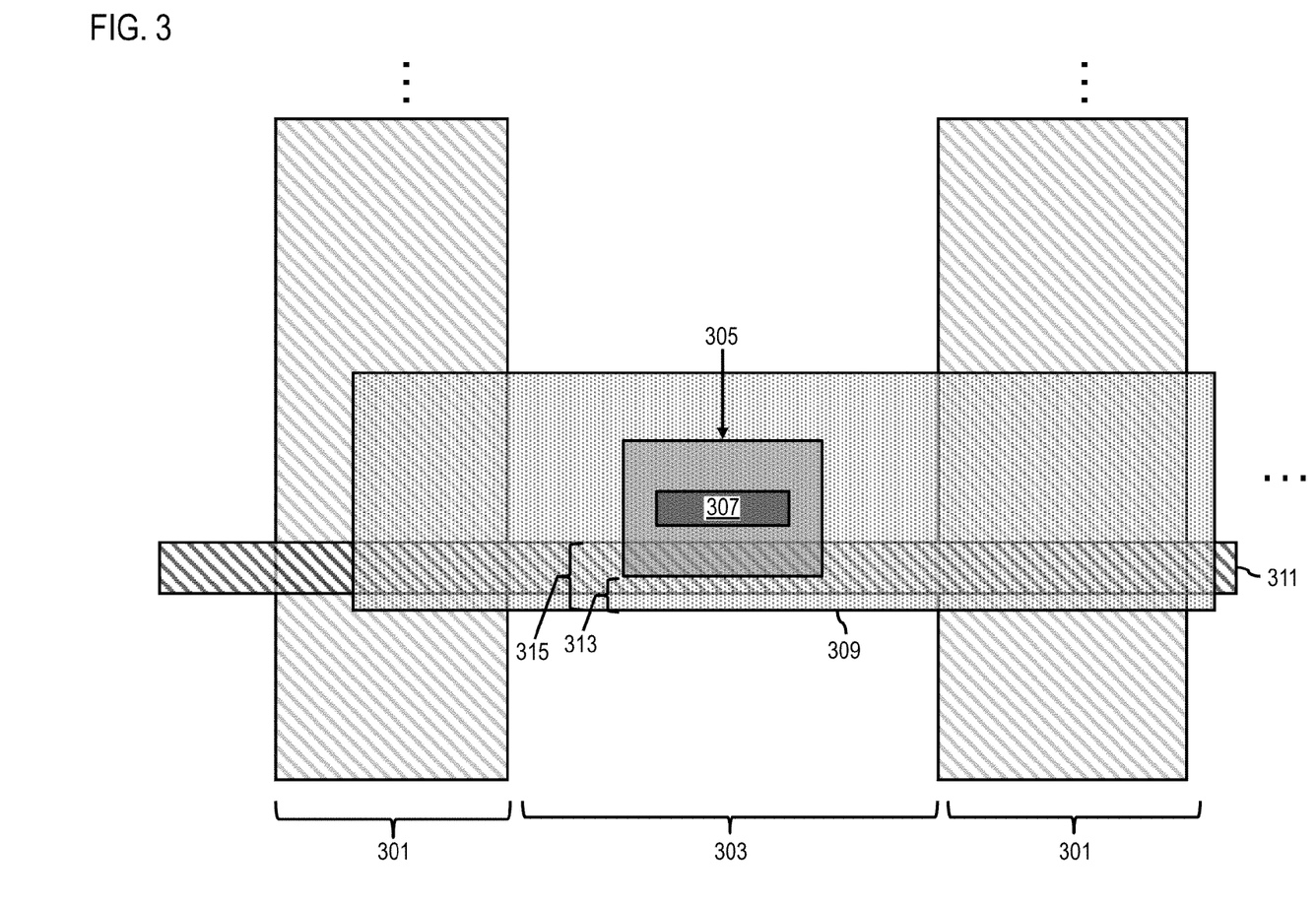
FIG. 3 schematically illustrates a method of improving RX region enclosure to implant mask of an SRAM bitcell in accordance with an exemplary embodiment.

FIG. 3 schematically illustrates a method of improving RX region enclosure to implant mask of an SRAM bitcell in accordance with an exemplary embodiment. Adverting to FIG. 3, NW regions 301 are separated by PW region 303 having RX region 305 with a tap 307. A PPLUS implant mask region 309 extends horizontally, in a strap region (e.g. 101) of an SRAM bitcell, across the NW regions 301 and the PW region 303. As shown, a (dummy) PC 311 provides an additional margin enclosure. For example, PPLUS implant mask region 309 provides a vertical margin distance 313 of 21 nm, and the PC 311 provides a vertical margin distance 315 of 36 nm. As such, PC 311 provides an increase in margin, resulting in an improved yield of a resulting device.

Figure 4A:
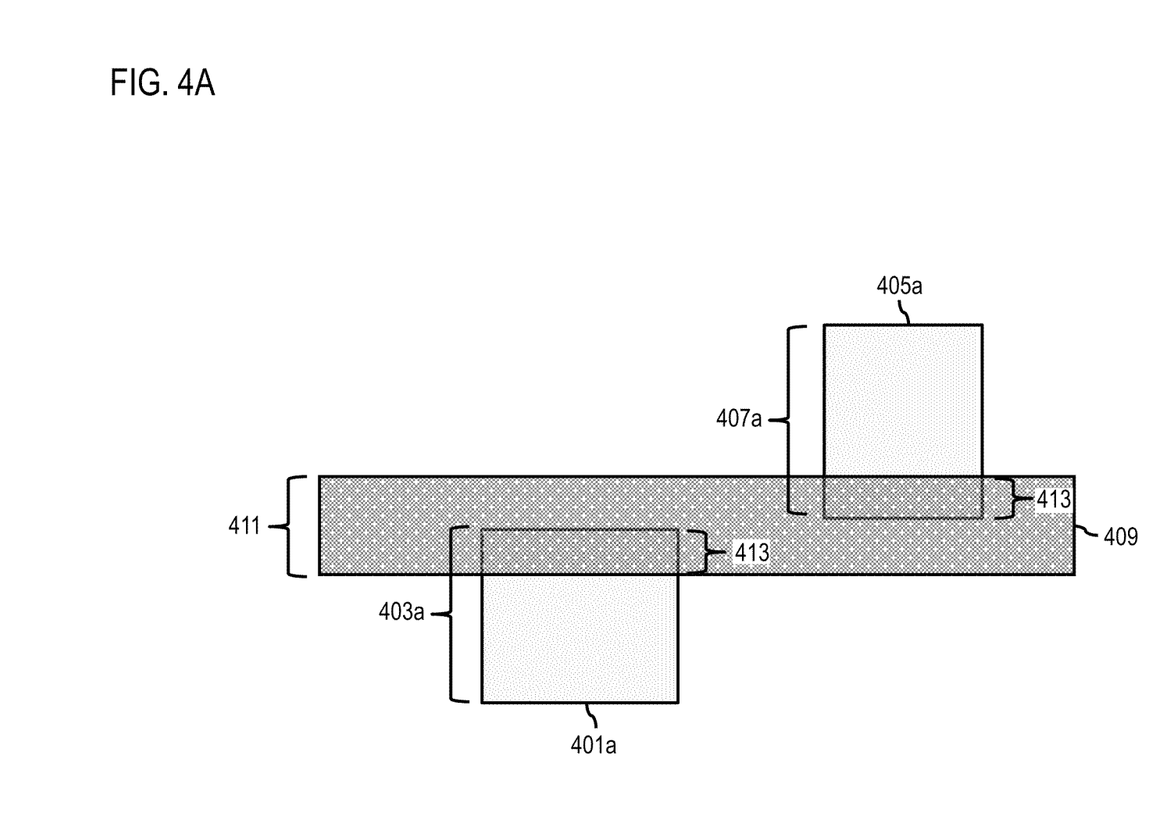
FIGS. 4A and 4B schematically illustrate a method of reducing a bitcell strap height of an SRAM bitcell in accordance with an exemplary embodiment.
Figure 4B:
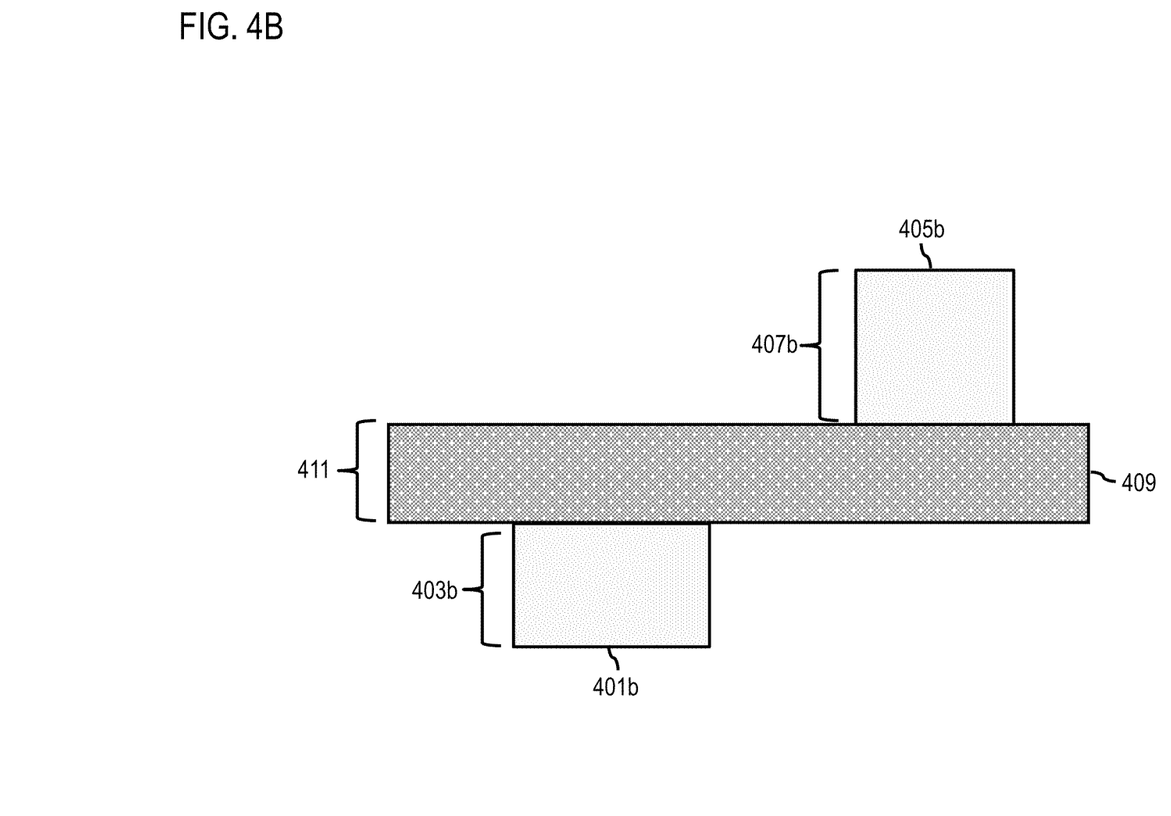

FIGS. 4A and 4B schematically illustrate a method of reducing a bitcell strap height of an SRAM bitcell in accordance with an exemplary embodiment. Adverting to FIG. 4A, a strap region (e.g., 101) includes an RX region 401a having a width 140 nm and a height 403a of 124 nm, and an RX region 405a having a width 114 nm and a height 407a of 138 nm. As shown, the RX regions 401a and 405a have separated vertical positions and the printing process limits further reducing the heights and widths of RX regions 401a and 405a. Next, an RX cut block 409 having a strap height 411 of twice a PC pitch (e.g., 70 nm) is provided over extended portions 413 of RX regions 401a and 405a. Adverting to FIG. 4B, the providing of RX cut block 409 results in RX region 401b having a height 403b of 92 nm, and RX region 405b having a height 407b of 108 nm. As such, RX regions 401b and 405b have a reduced size without affecting RX printability of a resulting design. Furthermore, use of an RX cut block allows implant masks generating RX regions to overlap, enabling IC designs to have a reduced vertical distance (e.g., strap height) from each other and resulting in a more efficient layout.

Figure 5A:
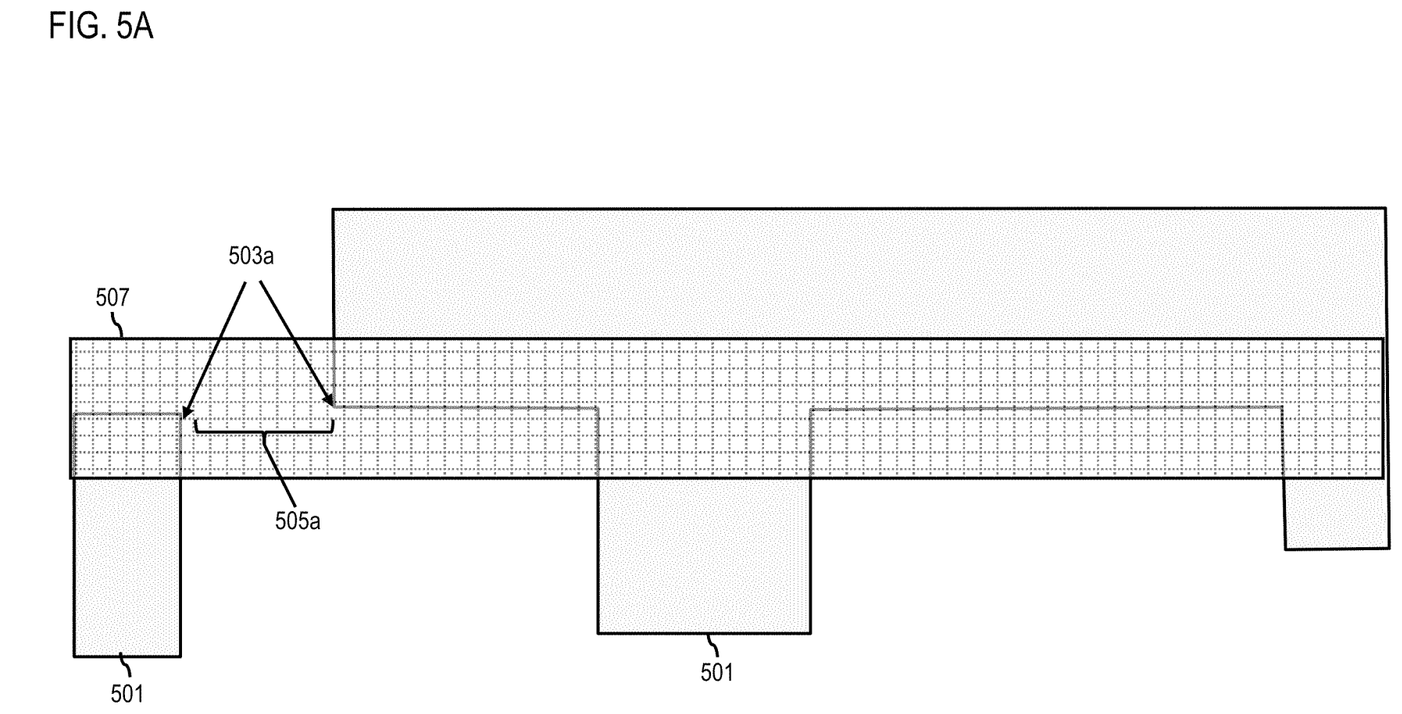
FIGS. 5A and 5B schematically illustrate a method of reducing impacts of implant mask corner rounding in a SRAM bitcell in accordance with an exemplary embodiment.
Figure 5B:
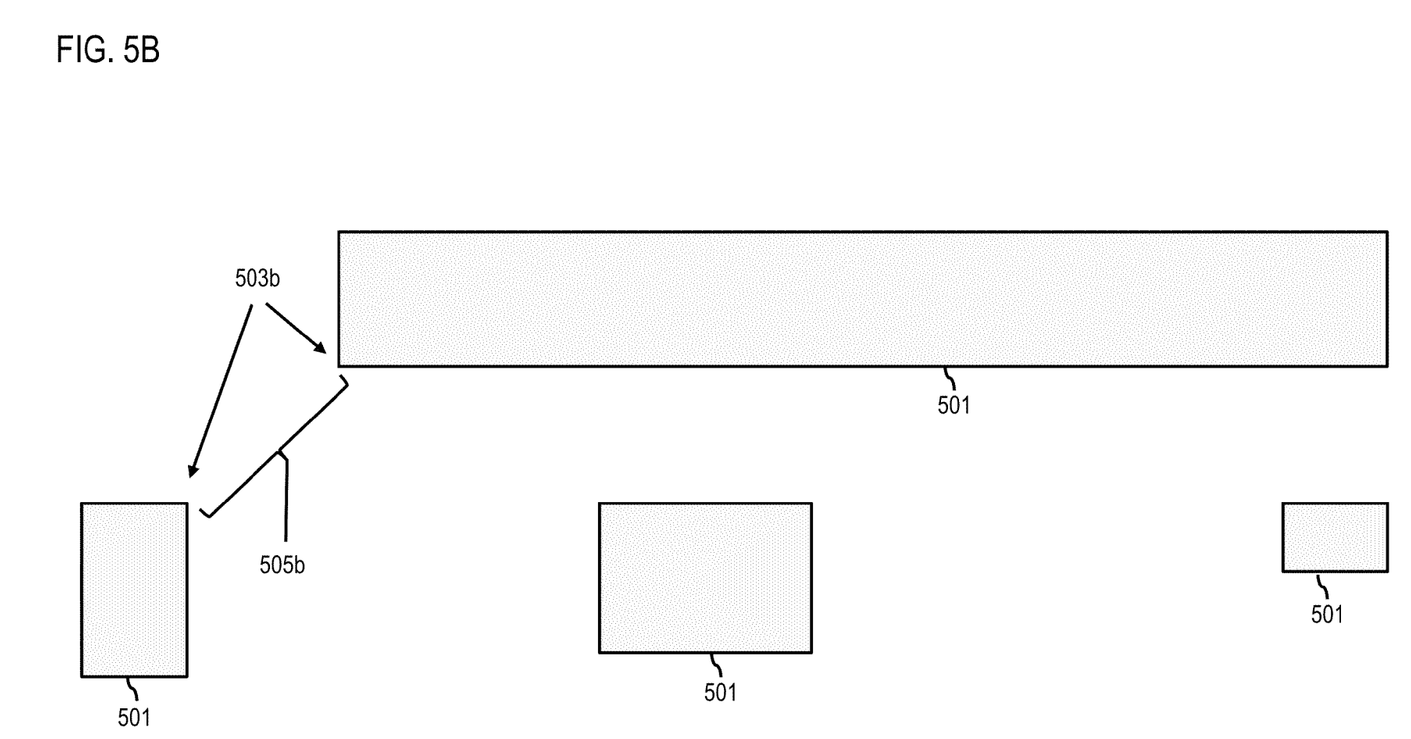

FIGS. 5A and 5B schematically illustrate a method of reducing impacts of implant mask corner rounding in a SRAM bitcell in accordance with an exemplary embodiment. Adverting to FIG. 5A, RX regions 501 have corners 503a separated by a distance 505a. Next, an RX cut block 507 having a strap height of twice a PC pitch (e.g., 70 nm) is provided over corners 503a. Adverting to FIG. 5B, the RX cut block 507 is removed. As shown, the providing of RX cut block 507 results in RX regions 501 having corners 503b separated by a distance 505b. Thus, potential impacts of a corner rounding affect are reduced by increasing the separation distance from distance 505a to 505b.

Figure 6A:
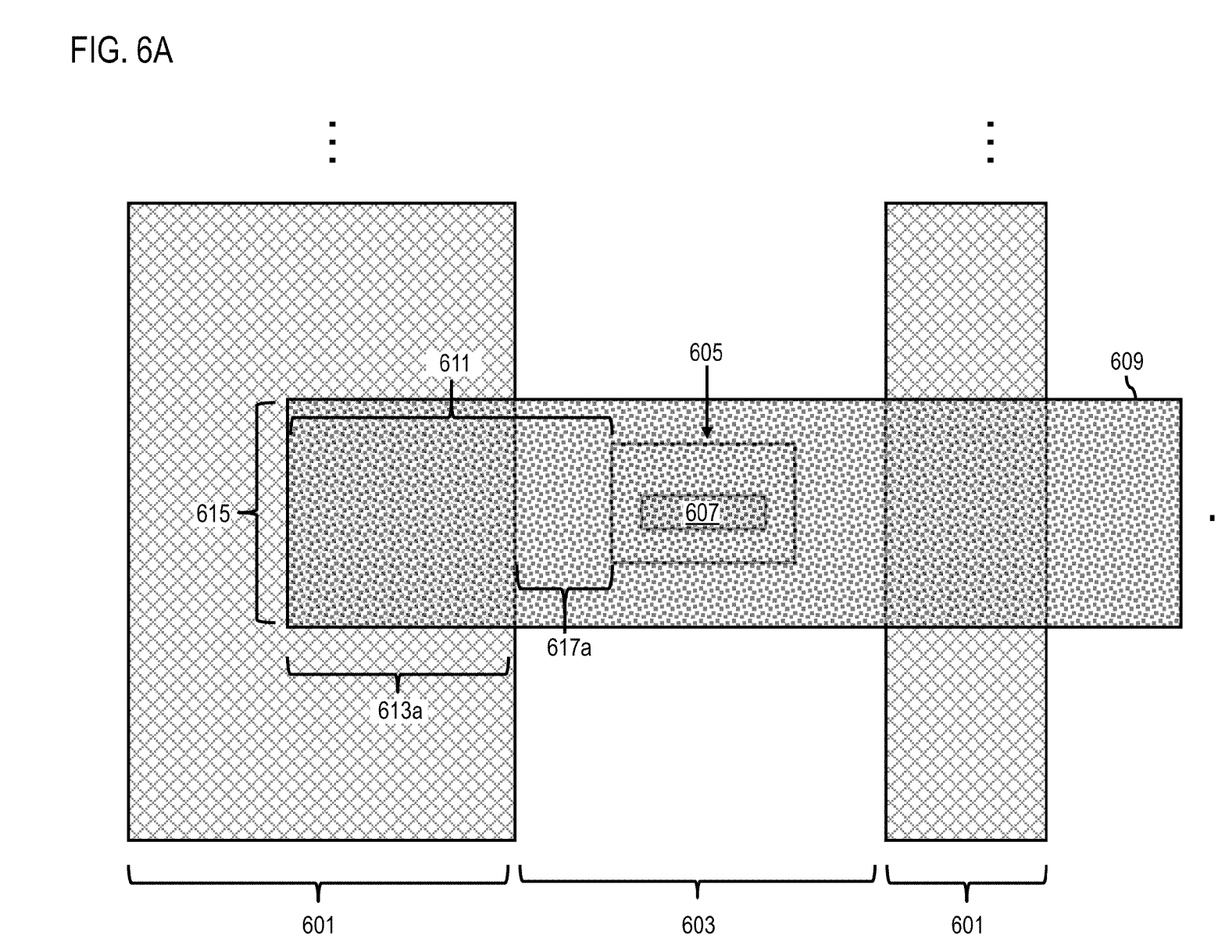
FIGS. 6A and 6B schematically illustrate a method of determining a gap/sliver restriction to reduce impacts of implant mask corner rounding in an SRAM bitcell in accordance with an exemplary embodiment.
Figure 6B:
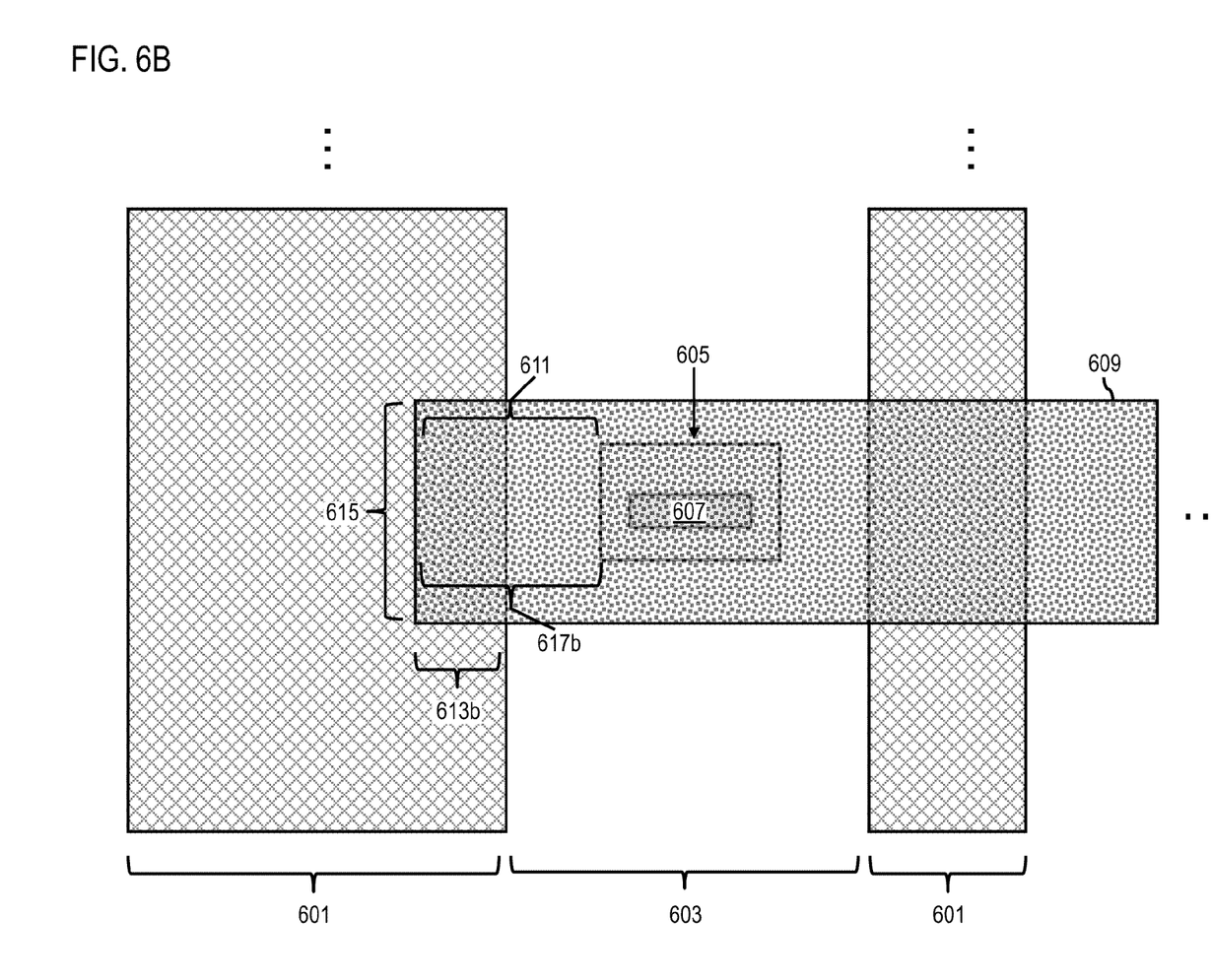

FIGS. 6A and 6B schematically illustrate a method of determining a gap/sliver restriction to reduce a block mask (e.g., RG, PPLUS, etc) corner rounding affect of a SRAM bitcell in accordance with an exemplary embodiment. Adverting to FIG. 6A, NW regions 601 are separated by PW region 603 having an RX region 605 with a drain/source contact 607. A PPLUS mask region 609 extends horizontally into the NW regions 601 and across a horizontal width of the PW region 603 and covers an entire upper surface of RX region 605 and drain/source contact 607. In order to improve a yield of a resulting device, the PPLUS mask region 609 has a horizontal endpoint at a predefined separation distance 611 from an edge of RX region 605. The predefined separation distance 611 is selected to account, for example, for drift of the RX region 605 towards the NW regions 601 and for corner rounding of PPLUS mask region 609. As such, an overlap of one of the NW regions 601 and the PPLUS mask region 609 is drawn having a width 613a and a height 615. However, traditional data preparation processes generate a TJ implant mask when the width 613a and/or height 615 exceed a threshold value. As such, many processes avoid drawing an overlap of the NW regions 601 and the PPLUS mask region 609, resulting in a generated separation distance of 617a. For instance, as shown, the width 613a is 101 nm and the height 615 is 156 nm, so the overlap would not be considered a sliver and a TJ mask would be generated during a data preparation step.

In order to improve the generated separation distance between horizontal endpoints of RX region 605 and PPLUS mask region 609, the area of overlap (e.g., width 613a and a height 615) is compared to a threshold value associated with the data preparation step, for instance, a minimum overlap area (e.g., sliver threshold), and/or a separation distance (e.g., gap threshold) prior to a data preparation step. Adverting to FIG. 6B, the width 613b is reduced from the width 613a such that the overlap is determined in a data preparation step to be a sliver. As such, no undesirable TJ implant mask is generated and the resulting generated separation distance of 617b is improved over the previous separation distance of 617a. As such, a raised source drain (RG) block and PPLUS enclosure to RX (and PW tap) may be modified to improve a resulting yield by reducing the effects of corner rounding without affecting printability of a resulting design.

The embodiments of the present disclosure can achieve several technical effects, including a reduction in edge and strap cell sizes of SRAM devices, thereby providing more efficient use of bitcell layout area. The present disclosure enjoys industrial applicability in any of various types of highly integrated semiconductor devices, particularly SRAM bitcells with edge and strap cells for the 20 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
    providing first and second n-type well (NW) regions on a substrate;
    providing first and second active (RX) regions on the first and second NW regions, respectively;
    providing a contact on the substrate connecting the first and second RX regions;

providing a dummy gate (PC) on the substrate connecting the first and second RX regions,
wherein the contact and dummy PC extend along a horizontal direction;
providing a plurality of PC segments on the substrate, each PC segment extending along the horizontal direction on one of a plurality of vertical positions; and
providing the first and second RX regions with first and second tap regions, respectively, the first and second tap regions being connected by the dummy PC and the contact.

2. The method according to claim 1, further comprising:
providing on the substrate first and second bitcell regions, each having PC segments on the vertical positions, the vertical positions within the first and second bitcells being separated; and
providing on the substrate a strap region separating the first and second bitcell regions.

3. The method according to claim 1, comprising providing a p-type well (PW) region separating the first and second NW regions, and providing a gate contact in the PW region, wherein the first and second tap regions and gate contact are connected by the dummy PC and by the contact.

4. The method according to claim 3, comprising providing a PW tap in the PW region separated from the dummy PC and the contact.

5. The method according to claim 1, comprising
providing a PW region on the substrate separating the first and second NW regions;
providing a third RX region in the PW region having a vertical position different from vertical positions of the first and second RX regions;
providing an implant mask over an entire upper surface of the third RX region and a portion extending vertically beyond a horizontal edge of the third RX region; and
providing a second dummy PC on the horizontal edge.

6. The method according to claim 5, comprising providing the second dummy PC overlapping a rectangular portion of the third RX region.

7. The method according to claim 5, wherein the second dummy PC extends along the horizontal direction, the method further comprising providing a plurality of PC segments on the substrate, each PC segment extending along the horizontal direction on one of a plurality of vertical positions.

8. The method according to claim 7, comprising:
providing a second PW region on the substrate, the second NW region separating the first and second PW regions;
providing a fourth RX region in the second PW region having a vertical position identical to the third RX region and having a second horizontal edge aligned with the horizontal edge of the third RX;
providing the implant mask over an entire upper surface of the fourth RX region and a portion extending vertically beyond the second horizontal edge of the fourth RX region, the implant mask extending across a horizontal width of the second NW region; and
providing the second dummy PC on the second horizontal edge.

9. The method according to claim 8, comprising:
providing a first bitcell region having two PC segments active with different vertical positions;
providing a second bitcell region having two PC segments active with different vertical positions; and
providing a strap region vertically separating the first and second bitcell regions, the implant mask and the third and fourth RX regions being in the strap region.

10. The method according to claim 1, comprising providing the first and second RX regions by:
printing first and second RX regions on a substrate, each including an extended portion in a vertical direction; and
providing an RX cut mask region over the extended portions.

11. The method according to claim 10 comprising providing on the substrate a third RX region having a vertical position different from the first and second RX regions by:
printing the third RX region on the substrate including a second extended portion in a second vertical direction opposite to the first vertical direction; and
providing the RX cut mask region over the second extended portion.

12. A method comprising:
determining an active (RX) region of an integrated circuit (IC) design;
determining a P+ implant mask region extending along a horizontal direction and being on an entire upper surface of the RX region;
determining a n-type well (NW) region extending along a vertical direction and separated from the RX region; and
comparing an area of an overlap of the NW region and P+ implant mask region to a threshold value.

13. The method according to claim 12, further comprising:
determining a p-type well (PW) region of the IC design, the RX region being in the PW region;
determining a second NW region, separated from the first NW region by the PW region, the P+ implant mask region extending into the first and second NW regions and across a horizontal width of the PW region; and
determining a horizontal endpoint of the P+ mask region extending into the first NW region based on a predefined separation distance between endpoints of the RX region and the P+ implant mask region.

14. The method according to claim 12, further comprising modifying the P+ implant mask region to reduce the overlap area to less than or equal to the threshold value prior to a data preparation step for the IC design.

15. An apparatus comprising:
a first n-type well (NW) region on a substrate having a first NW tap;
a second NW region on the substrate having a second NW tap;
a p-type well (PW) region separating the first and second NW regions and having a PW tap and a gate contact, the gate contact and the first and second NW taps having identical vertical positions and the PW tap having a different vertical position from the gate contact and the first and second NW taps;
a drain/source contact extending along a horizontal direction on the substrate and connecting the gate contact and the first and second NW taps, the drain/source contact being separated from the PW tap;
a plurality of gate (PC) segments on the substrate, each PC segment extending along the horizontal direction on one of a plurality of separated vertical positions; and
a dummy PC on the substrate extending along the horizontal direction on the substrate and connecting the gate contact and the first and second NW taps, the dummy PC having a vertical position different from a vertical position of the drain/source contact.

16. The apparatus according to claim 15, comprising:
an active (RX) region in the PW region vertically separated from the first and second NW taps;

an RG block over an entire upper surface of the RX region and a portion extending vertically outside of a horizontal edge of the RX region; and a second dummy PC extending in the horizontal direction and overlapping a rectangular portion of the RX region including the horizontal edge.

17. The apparatus according to claim 15, comprising:

a first bitcell region having two PC segments active with different vertical positions;

a second bitcell region having two PC segments active with different vertical positions; and a strap region vertically separating the first and second bitcell regions, the RG block and the RX region being in the strap region.

* * * * *